(12) United States Patent
Yang

(10) Patent No.: US 11,056,487 B2
(45) Date of Patent: Jul. 6, 2021

(54) SINGLE DIFFUSION BREAK LOCAL INTERCONNECT

(71) Applicant: QUALCOMM Incorporated, San Diego, CA (US)

(72) Inventor: Haining Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/569,911

(22) Filed: Sep. 13, 2019

(65) Prior Publication Data

US 2021/0082913 A1 Mar. 18, 2021

(51) Int. Cl.
*H01L 27/088* (2006.01)
*H01L 21/762* (2006.01)
*H01L 23/535* (2006.01)

(52) U.S. Cl.
CPC ...... *H01L 27/088* (2013.01); *H01L 21/76224* (2013.01); *H01L 23/535* (2013.01)

(58) Field of Classification Search
CPC ............... H01L 21/6224; H01L 21/845; H01L 21/823878; H01L 27/0886
See application file for complete search history.

(56) References Cited

U.S. PATENT DOCUMENTS 9,412,616 B1 * 8/2016 Xie ..................... H01L 27/1211

* cited by examiner

*Primary Examiner* — Caridad Everhart
(74) *Attorney, Agent, or Firm* — Patterson & Sheridan, L.L.P.

(57) ABSTRACT

Certain aspects of the present disclosure generally relate to a single diffusion break having a conductive portion. An example semiconductor device generally includes a first semiconductor region, a second semiconductor region, a dielectric region, and a single diffusion break (SDB). The dielectric region is disposed between the first semiconductor region and the second semiconductor region. The SDB intersects at least one of the first semiconductor region or the second semiconductor region, and the SDB comprises an electrically conductive portion.

20 Claims, 14 Drawing Sheets

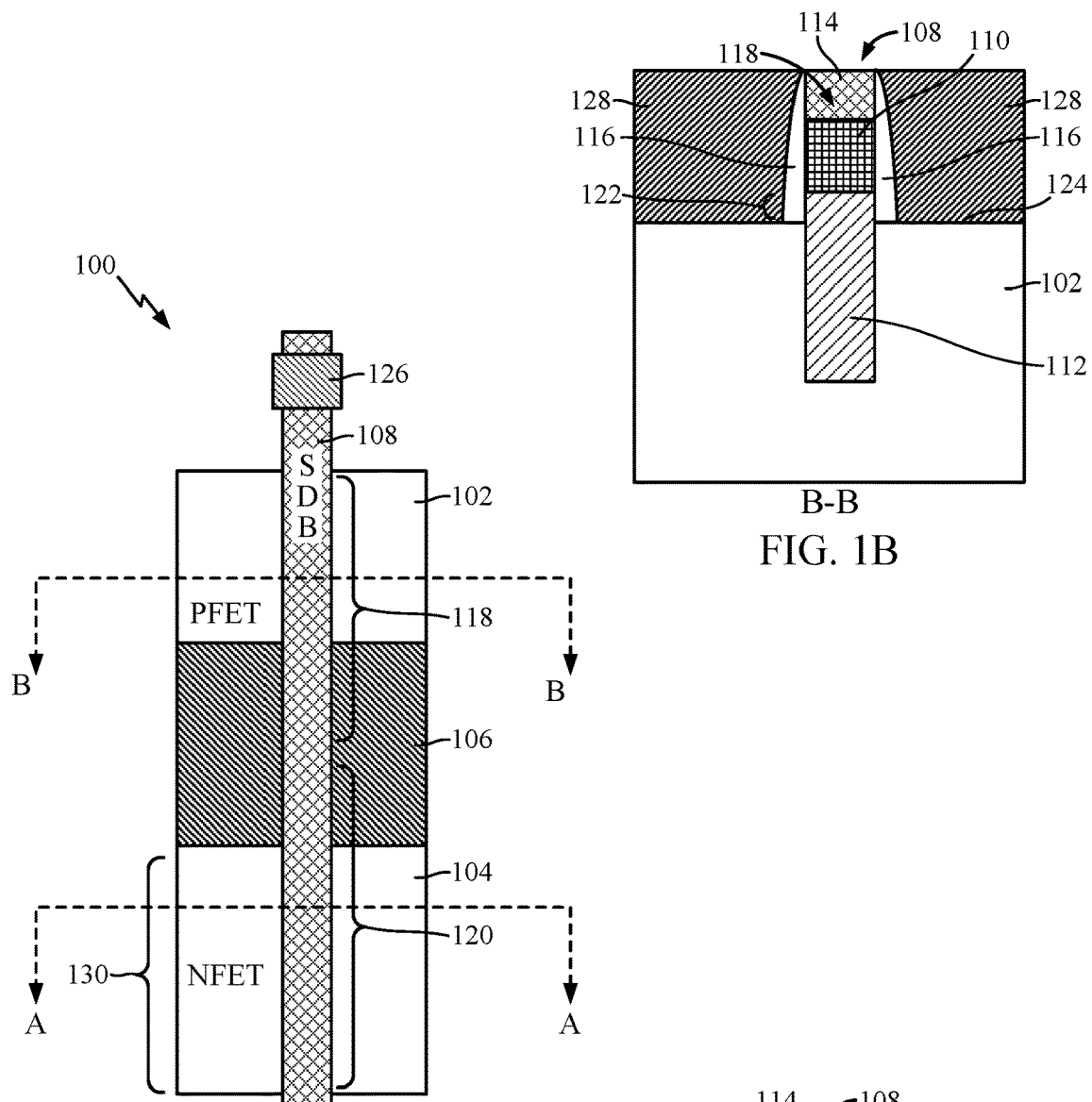
FIG. 1B
FIG. 1A
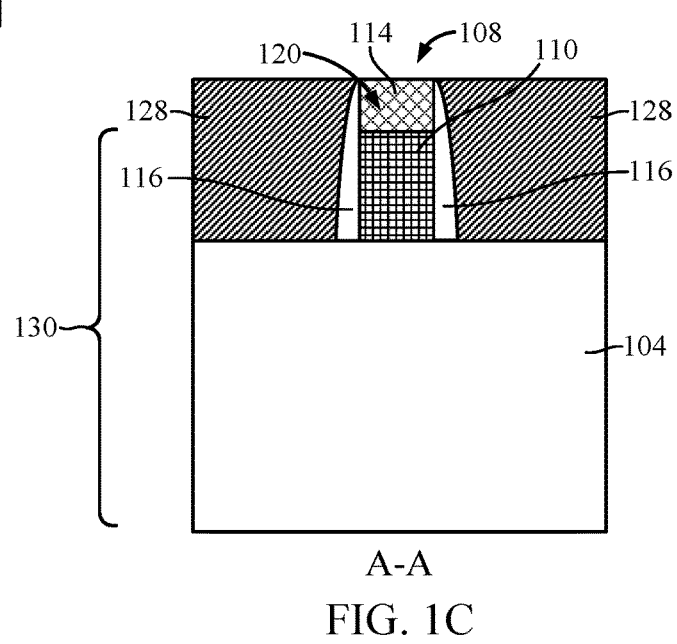
A-A
FIG. 1C

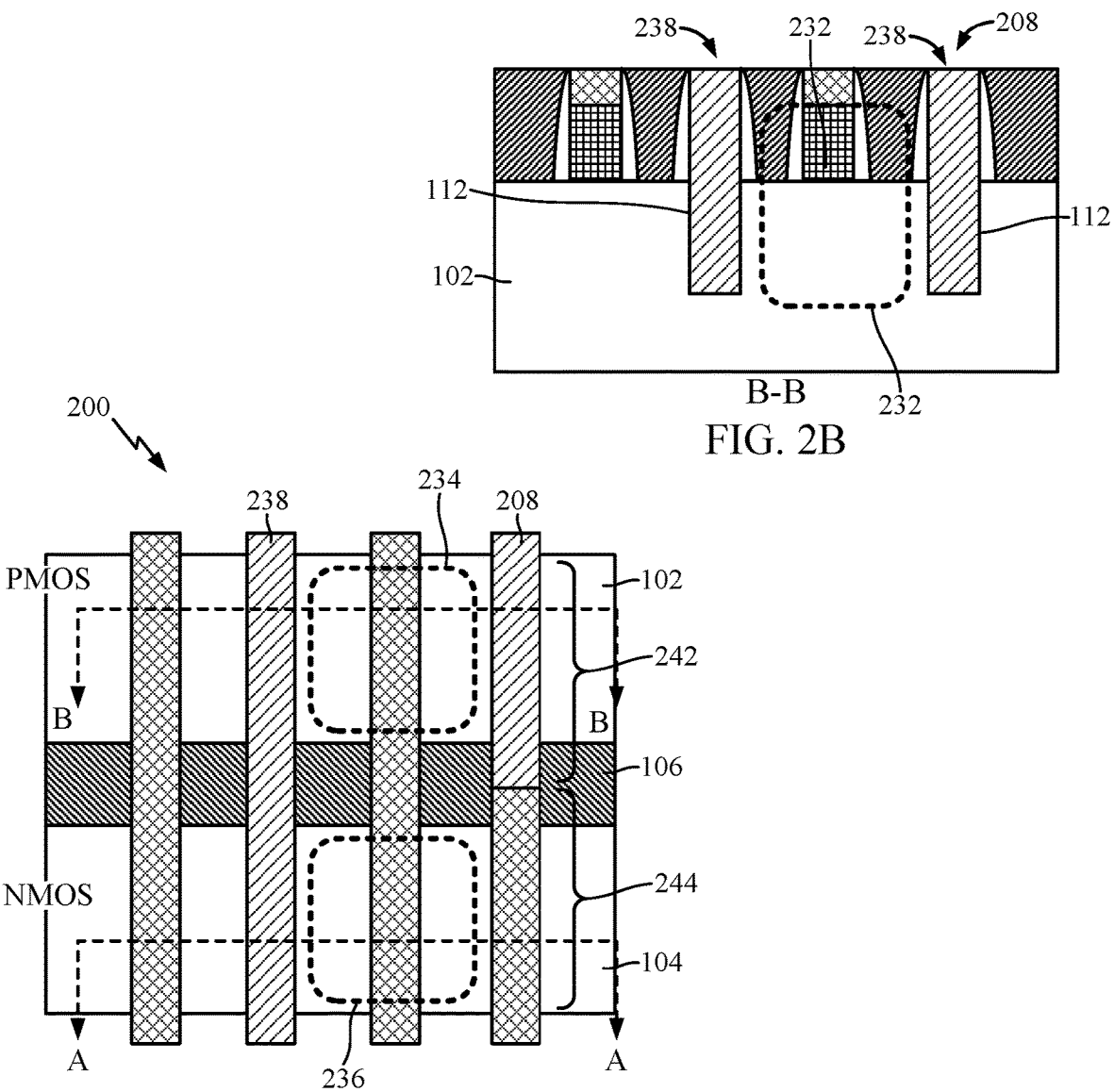

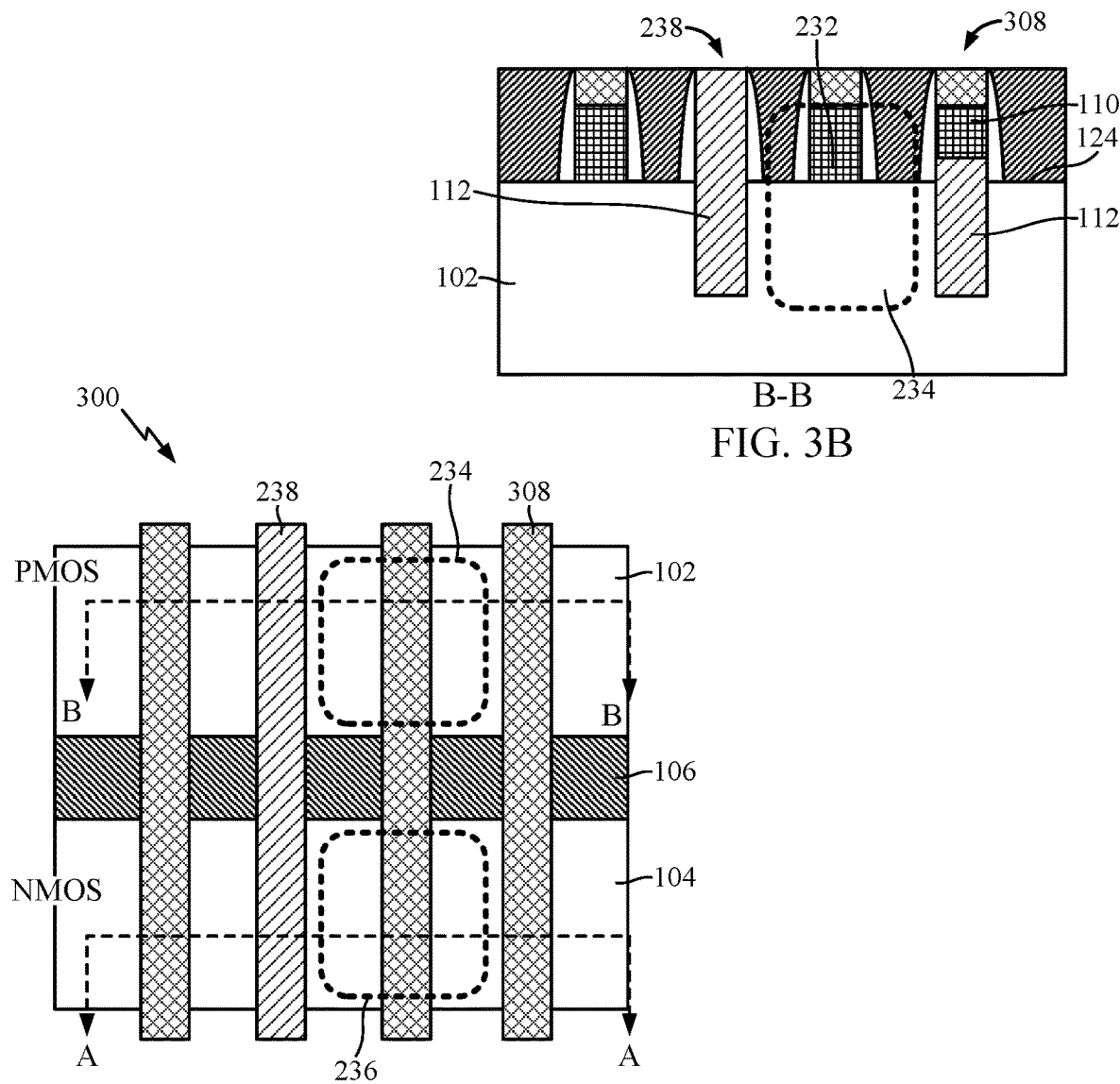
FIG. 3B
FIG. 3A
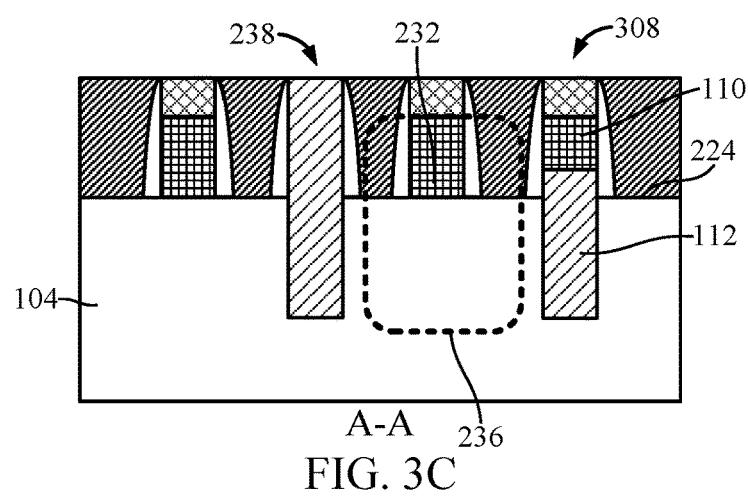
FIG. 3C

B-B

A-A

B-B

A-A

B-B

A-A

B-B

A-A

B-B

A-A

B-B

A-A

SINGLE DIFFUSION BREAK LOCAL INTERCONNECT

BACKGROUND

Field of the Disclosure

Certain aspects of the present disclosure generally relate to integrated circuits and, more particularly, to a single diffusion break, having a conductive portion, disposed between transistors.

Description of Related Art

As electronic devices are getting smaller and faster, the demand for integrated circuits (ICs) with higher I/O count, faster data processing rate, and better signal integrity greatly increases. The ICs may include various transistors forming memory circuits, logic circuits, amplifiers, comparators, etc. The transistors of an IC may be separated by insulated regions called diffusion breaks, such as a double diffusion break or a single diffusion break. A double diffusion break may occupy two dummy gate spaces, and a single diffusion break may occupy a single dummy gate space.

A transistor is a semiconductor device used to amplify or switch electronic signals and/or electrical power. There are several types of transistors, one of the most common types being a metal-oxide-semiconductor field-effect transistor (MOSFET). A MOSFET may be implemented as a p-type transistor, referred to as a p-type metal-oxide-semiconductor (PMOS) transistor, or an n-type transistor, referred to as an n-type metal-oxide-semiconductor (NMOS) transistor, both of which have a similar structure, but are implemented with semiconductor regions having opposite doping types.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include an improved single diffusion break having local interconnects.

Certain aspects of the present disclosure provide a semiconductor device. The semiconductor device generally includes a first semiconductor region, a second semiconductor region, a dielectric region, and a single diffusion break (SDB). The dielectric region is disposed between the first semiconductor region and the second semiconductor region. The SDB intersects at least one of the first semiconductor region or the second semiconductor region, and the SDB comprises an electrically conductive portion.

Certain aspects of the present disclosure provide a method of fabricating a semiconductor device. The method generally includes forming a dielectric region between a first semiconductor region and a second semiconductor region and forming an SDB that intersects at least one of the first semiconductor region or the second semiconductor region, where the SDB comprises an electrically conductive portion.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 1A illustrates a top view of an example single diffusion break (SDB) electrically coupled to a transistor, in accordance with certain aspects of the present disclosure.

FIG. 1B illustrates a cross-sectional view of the example SDB of FIG. 1A, in accordance with certain aspects of the present disclosure.

FIG. 1C illustrates another cross-sectional view of the example SDB of FIG. 1A, in accordance with certain aspects of the present disclosure.

FIG. 2A illustrates a top view of example SDBs, one of which has an electrically conductive portion and insulative portion, in accordance with certain aspects of the present disclosure.

FIG. 2B illustrates a cross-sectional view of the example SDBs of FIG. 2A, in accordance with certain aspects of the present disclosure.

FIG. 2C illustrates another cross-sectional view of the example SDBs of FIG. 2A, in accordance with certain aspects of the present disclosure.

FIG. 3A illustrates a top view of example SDBs, one of which has an electrically conductive portion, in accordance with certain aspects of the present disclosure.

FIG. 3B illustrates a cross-sectional view of the example SDBs of FIG. 3A, in accordance with certain aspects of the present disclosure.

FIG. 3C illustrates another cross-sectional view of the example SDBs of FIG. 3A, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 4B:
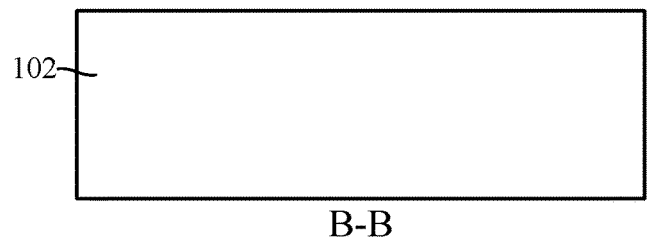
FIG. 4B illustrates a cross-sectional view of one of the semiconductor regions of FIG. 4A, in accordance with certain aspects of the present disclosure.

Certain aspects of the present disclosure relate to single diffusion breaks (SDBs) with a conductive portion that facilitates electrical connections through at least a portion of the SDB.

Example Single Diffusion Break with Local Interconnect

In the micro-electronic technology industry, there is a continuous demand and evolution of processes, technologies, and assembly methodologies to design and implement smaller, more efficient integrated circuits (ICs). An individual transistor of an IC may be electrically isolated from other transistors using a single diffusion break (SDB), which may occupy a single dummy gate. The SDB may have smaller footprint (e.g., an SDB may be about 20 nm wide versus a double diffusion break (DDB) or a mixed diffusion break (MDB) having a width of about 54 nm) to save chip area, but the SDB dummy gate consists of an insulator and conventionally could not be used as a local electrical interconnect. Thus, the SDB may hinder the electrical routing options for ICs at the transistor level, resulting in an increased circuit area and performance issues (such as higher parasitic capacitance).

Certain aspects of the present disclosure relate to SDBs with a conductive portion to facilitate electrical connections through at least a portion of the SDB. With the conductive portion, the SDB may serve as a local electrical interconnect at the transistor level of a front-end-of-line (FEOL) IC fabrication process. An SDB with a conductive portion may improve the layout efficiency of the IC, resulting in a reduced circuit area and improved performance (e.g., lower parasitic capacitance). The conductive SDB may provide layout flexibility and improve efficiencies with regard to circuit area reduction of an IC. Parasitic capacitances encountered at the transistors may be reduced with the conductive SDB by allowing for electrical connections at the gate level rather than making the gate connections through a higher metal layer. The conductive SDB may also reduce metal congestion at the higher metal layers disposed above the transistors.

An SDB with a conductive portion may enable various electrical interconnections at the transistor level of an IC. For example, the SDB may be electrically coupled to a gate terminal of an active transistor. As another example, the SDB may have a segment that is conductive and another segment that is insulating. The conductive segment of the SDB may provide a via pad for electrical routing. In some cases, the SDB may electrically isolate adjacent transistors, but also offer an electrically conductive path through the SDB. That is, the SDB may have a conductive portion that runs the entire length of the SDB. The conductive SDB may be implemented jointly with a separate insulating SDB for lower parasitic capacitances between transistors. As used herein, a "conductive SDB" generally refers to an SDB having an insulative portion and one or more conductive portions, and an "insulating SDB" generally refers to an SDB having an insulative portion with no conductive portions. In certain aspects, the SDB conducting region may be formed during metal gate formation of the transistors.

FIG. 1A illustrates a top view of an example semiconductor device 100 having an SDB with an electrically conductive portion, in accordance with certain aspects of the present disclosure. FIGS. 1B and 1C illustrate cross-sectional views of the example semiconductor device 100 along the cross-sections taken across lines B-B and A-A, respectively, as depicted in FIG. 1A.

Referring to FIG. 1A, the semiconductor device 100 may be any suitable integrated circuit having transistors that may perform, for example, switching or signal amplification operations. The semiconductor device 100 may be included in an integrated circuit die fabricated, for example, in a wafer-level package and/or a chip-scale package. As an example, the semiconductor device 100 may be a processor including a central processor, a graphics processor, a digital signal processor (DSP), an application specific integrated circuit (ASIC), a field programmable gate array (FPGA) or other programmable logic device (PLD), discrete gate or transistor logic, discrete hardware components, or any combination thereof and/or a memory device. In other cases, the semiconductor device 100 may be a power management integrated circuit that performs, for example, voltage regulation, power source selection, battery charging management, etc.

As shown, the semiconductor device 100 may include a first semiconductor region 102, a second semiconductor region 104, a dielectric region 106, and an SDB 108. The first semiconductor region 102 may be a p-type metal-oxide-semiconductor (PMOS) region. For example, the first semiconductor region 102 may include a p+ doped semiconductor (e.g., p+ doped silicon), such as an implant region for a source and/or drain of a PMOS transistor.

The second semiconductor region 104 may be an n-type metal-oxide-semiconductor (NMOS) region. For example, the second semiconductor region 104 may include an n+ doped semiconductor (e.g., n+ doped silicon), such as an implant region for a source and/or drain of an NMOS transistor. While the examples provided herein are described with respect to the first semiconductor region 102 being a PMOS region and the second semiconductor region 104 being an NMOS region to facilitate understanding, aspects of the present disclosure may also be applied to other suitable semiconductor configurations for the first semiconductor region 102 and the second semiconductor region 104, such as the first semiconductor region 102 being an NMOS region and the second semiconductor region 104 being a PMOS region or the first and second semiconductor regions 102, 104 having the same doping type.

The dielectric region 106 is disposed between the first semiconductor region 102 and the second semiconductor region 104. The dielectric region 106 may include a shallow trench isolation (STI) region that electrically isolates the semiconductor regions 102, 104 from each other.

The SDB 108 intersects at least one of the first semiconductor region 102 or the second semiconductor region 104. The SDB 108 may include an electrically conductive portion 110 (as shown in FIGS. 1B and 1C) and an insulator 112 (as shown in FIG. 1B). In certain aspects, the SDB 108 may also include a gate cap 114 (as shown in FIGS. 1B and 1C) and one or more gate spacers 116 (as shown in FIGS. 1B and 1C).

The conductive portion 110 of the SDB 108 may comprise any of various suitable materials for electrical conduction, such as copper (Cu), silver (Ag), or gold (Au). The conductive portion 110 of the SDB 108 may provide an electrically conductive path for routing electrical signals (such as power signals, analog signals, or digital signals) at the transistor-level of the semiconductor device 100. For example, the conductive portion 110 may be electrically coupled to a gate contact 126 and the second semiconductor region 104, which may be part of an active transistor 130. The conductive portion 110 may enable electrical routing to the gate of the transistor 130 from the gate contact 126, which may in turn enable electrical routing to one or more layers disposed above the transistor 130.

The conductive portion 110 of the SDB 108 may be disposed above the first semiconductor region 102 and the second semiconductor region 104. Referring to FIG. 1A, the conductive portion 110 may include a first segment 118 of the conductive portion 110 and a second segment 120 of the conductive portion 110. As shown in FIG. 1B, the first segment 118 of the conductive portion 110 may be disposed above the first semiconductor region 102 and the insulator 112, and as shown in FIG. 1C, the second segment 120 of the conductive portion 110 may be disposed above the second semiconductor region 104 (e.g., with no insulator 112 in this portion of the SDB 108).

The insulator 112 may electrically isolate adjacent semiconductor regions, such as the first semiconductor region 102 and/or the second semiconductor region 104. The insulator 112 may intersect at least a portion of the first semiconductor region 102. As shown in FIG. 1B, a portion 122 of the insulator 112 may extend above a surface 124 of the first semiconductor region 102, and the first segment 118 of the conductive portion 110 may be displaced from the first semiconductor region 102 by the portion 122 of the insulator 112. The displaced segment of the conductive portion 110 may enable the conductive portion 110 to be electrically isolated from the first semiconductor region 102.

The gate cap 114 may be an insulating cap (e.g., a dielectric cap) disposed above the conductive portion 110. The gate cap 114 may electrically separate the conductive portion 110 from other electrical components (not shown) that may be disposed above the conductive portion 110 in the semiconductor device 100.

The gate spacers 116 may be adjacent to the conductive portion 110 and disposed above the semiconductor regions 102, 104. The gate spacers 116 may facilitate aligning the doping of the semiconductor regions 102, 104 for active transistors.

As shown in FIGS. 1B and 1C, interlayer dielectric (ILD) regions 128 may be disposed above the semiconductor regions 102, 104 and the dielectric region 106, and the SDB 108 may be disposed between the interlayer dielectric regions 128. The interlayer dielectric regions 128 may electrically separate the semiconductor regions 102, 104 from other electrical components (not shown) that may be disposed above the semiconductor regions 102, 104 in the semiconductor device 100.

In this example, the transistor 130 may include a portion of the second semiconductor region 104 and the second segment 120 of the conductive portion 110. As shown in FIG. 1C, the second segment 120 of the conductive portion 110 may be electrically coupled to the portion of the second semiconductor region 104, and the second segment 120 of the conductive portion 110 may serve as a gate terminal of the transistor 130.

In certain aspects, the conductive portion of the SDB may only be disposed above one of the semiconductor regions. Expressed another way, the conductive portion of the SDB may not be disposed above all the semiconductor regions, or only a portion of the SDB may have a conductive portion. For example, FIG. 2A illustrates a top view of an example semiconductor device 200 having an SDB 208 with a segment that is electrically conducting and insulating and another segment that is entirely electrically insulating, in accordance with certain aspects of the present disclosure. FIGS. 2B and 2C illustrate cross-sectional views of the example semiconductor device 200 along the cross-sections taken across lines B-B and A-A, respectively, as depicted in FIG. 2A.

As shown, the semiconductor device 200 may include the first semiconductor region 102, the second semiconductor region 104, the dielectric region 106, a first SDB 208, a conductive trace 232, a first transistor 234, a second transistor 236, and a second SDB 238.

In this example, the first SDB 208 has a segment that is electrically conducting and insulating and another segment that is entirely electrically insulating. For instance, the insulator 112 of the first SDB 208 has a first segment 242 that intersects the first semiconductor region 102 and a second segment 244 that intersects the second semiconductor region 104. As shown in FIG. 2B, there may be no conducive portion of the first SDB 208 disposed above the first segment 242 of the insulator 112. That is, the conductive portion 110 may be disposed above only one of the semiconductor regions 102, 104. As shown, the conductive portion 110 may not extend across the first semiconductor region 102. The conductive portion 110 of the SDB 208 may be disposed above the second segment 244 of the insulator 112 of the SDB 208. For instance, the conductive portion 110 may be disposed above a segment of the insulator 112 that extends above a surface 224 of the second semiconductor region 104, for example as described herein, with respect to FIG. 1B.

In certain aspects, the conductive portion 110 may be electrically coupled to a conductive via similar to the gate contact of FIG. 1A. For example, the conductive portion 110 may serve as a contact pad for conductive vias routing to upper layers or lower layers of the semiconductor device 200. In other cases, the conductive portion 110 may be electrically coupled to other conductors disposed at the transistor level, such as the conductive trace 232.

The conductive trace 232 is laterally spaced from the first SDB 208 and disposed above the first semiconductor region 102 and the second semiconductor region 104. The conductive trace 232 may have a first segment and second segment that coincide with the segments 242, 244 of the insulator 112, respectively. The conductive trace 232 may serve as the gate terminals for the first and second transistors 234 and 236.

The first transistor 234 includes a portion of the first semiconductor region 102 and a first segment of the conductive trace 232. The first segment of the conductive trace 232 is electrically coupled to the portion of the first semiconductor region 102 and may function as a gate terminal of the first transistor 234.

The second transistor 236 includes a portion of the second semiconductor region 104 and a second segment of the conductive trace 232. The second segment of the conductive trace 232 is electrically coupled to the portion of the second semiconductor region 104 and may function as a gate terminal of the second transistor 236.

In certain aspects, the semiconductor device 200 may include an SDB without a conductive portion. The second SDB 238 may electrically separate portions of the first semiconductor region 102 from each other and likewise electrically separate portions of the second semiconductor region 104 from each other. For example, the second SDB 238 may intersect the first semiconductor region 102 and the second semiconductor region 104. The second SDB 238 may include the insulator 112 that intersects the first semiconductor region 102 and the second semiconductor region 104. The first and second transistors 234, 236 may be disposed between the first SDB 208 and the second SDB 238. That is, the second SDB 238 is laterally spaced from the first and second transistors 234, 236.

FIG. 3A illustrates a top view of an example semiconductor device 300 having an SDB 308 with an electrically conductive portion that is electrically separated from and intersects the semiconductor regions, in accordance with certain aspects of the present disclosure. FIGS. 3B and 3C illustrate cross-sectional views of the example semiconductor device 300 along the cross-sections taken across lines B-B and A-A, respectively, as depicted in FIG. 3A.

As shown, the semiconductor device 300 may include the first semiconductor region 102, the second semiconductor region 104, the dielectric region 106, a first SDB 308, the conductive trace 232, the first transistor 234, the second transistor 236, and the second SDB 238.

In this example, the conductive portion 110 of the first SDB 308 is disposed above the first semiconductor region 102 and the second semiconductor region 104. In certain aspects, the conductive portion 110 is electrically separated from the first and second semiconductor regions 102, 104 by the insulator 112. For instance, a segment of the insulator 112 may extend above a surface 124 of the first semiconductor region 102 and a surface 224 of the second semiconductor region 104, as described herein with respect to FIG. 1B. The conductive portion 110 may be displaced from the semiconductor regions 102, 104 by the segments of the insulator 112 that extend above the semiconductor regions 102, 104. In SDB 308, both the conductive portion 110 and the insulator 112 may extend the entire length of the SDB, or at least across multiple semiconductor regions, as portrayed.

In certain aspects, the conductive portion 110 may be electrically coupled to a conductive via similar to the gate contact of FIG. 1A. For example, the conductive portion 110 may serve as a contact pad for conductive vias routing to upper layers or lower layers of the semiconductor device 300. In other cases, the conductive portion 110 may be electrically coupled to other conductors disposed at the transistor level, such as the conductive trace 232.

It should be appreciated that a semiconductor device may include any of the SDBs described herein with a conductive portion (e.g., SDB 108, 208, 308) to enable improved electrical routing options at the transistor level.

FIGS. 4A-13C illustrate example operations for fabricating a semiconductor device having an SDB with an electrically conductive portion, in accordance with certain aspects of the present disclosure. The operations may be performed by a semiconductor fabrication facility, for example. FIGS. 4A, 5A, 6A, 7A, 8A, 9A, 10A, 11A, 12A, and 13A illustrate example top views of the fabrication operations, and FIGS. 4B, 5B, 6B, 7B, 8B, 9B, 10B, 11B, 12B, and 13B and FIGS. 4C, 5C, 6C, 7C, 8C, 9C, C, 11C, 12C, and 13C illustrate corresponding cross-sectional views along the cross-sections taken across lines B-B and A-A of the operations depicted in FIGS. 4A, 5A, 6A, 7A, 8A, 9A, 10A, 11A, 12A, and 13A, respectively.

Figure 4A:
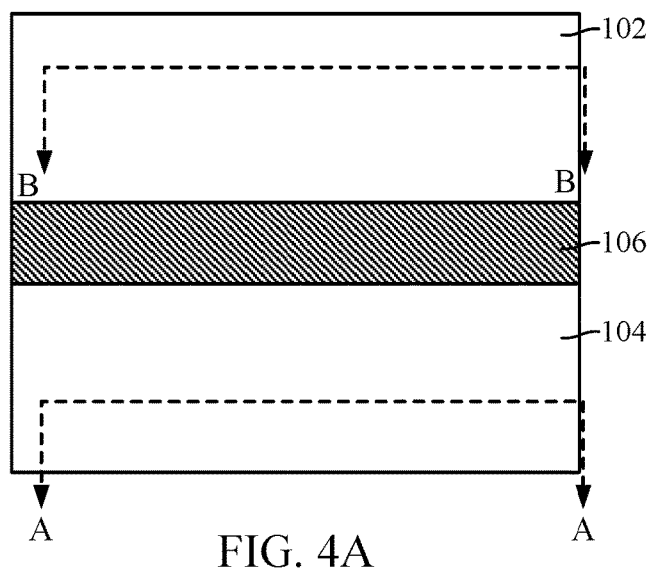
FIG. 4A illustrates a top view of two semiconductor regions separated by a dielectric region, in accordance with certain aspects of the present disclosure.
Figure 4C:
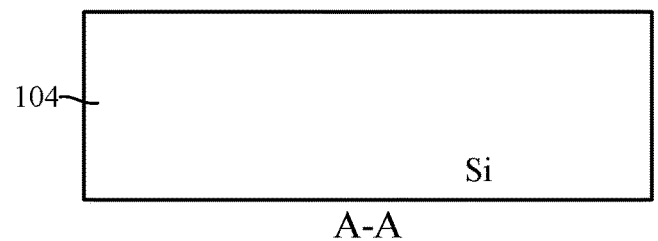
FIG. 4C illustrates a cross-sectional view of the other semiconductor region of FIG. 4A, in accordance with certain aspects of the present disclosure.

As shown in FIGS. 4A-C, the dielectric region 106 may be formed between the first semiconductor region 102 and the second semiconductor region 104. As an example, the dielectric region 106 may be formed by etching a pattern of trenches in a semiconductor region that coincides with the dielectric region, depositing one or more dielectric materials (such as silicon dioxide) to fill the trenches, and removing the excess dielectric using a technique such as chemical-mechanical planarization (CMP).

Figure 5B:
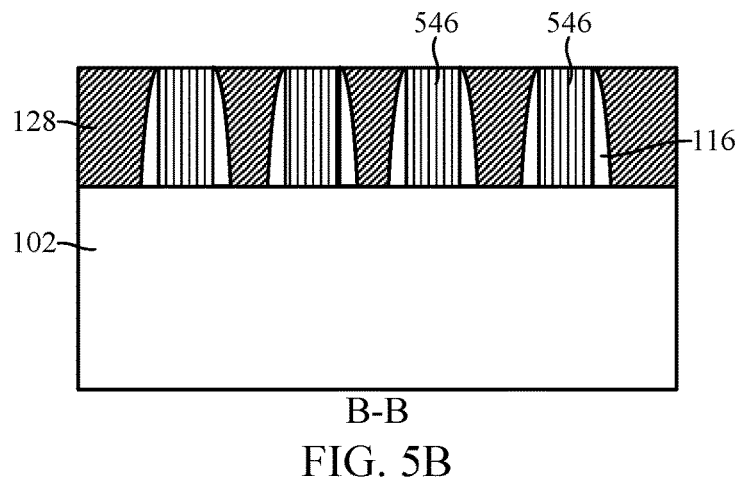
FIG. 5B illustrates a cross-sectional view of one of the semiconductor regions of FIG. 5A, in accordance with certain aspects of the present disclosure.
Figure 5A:
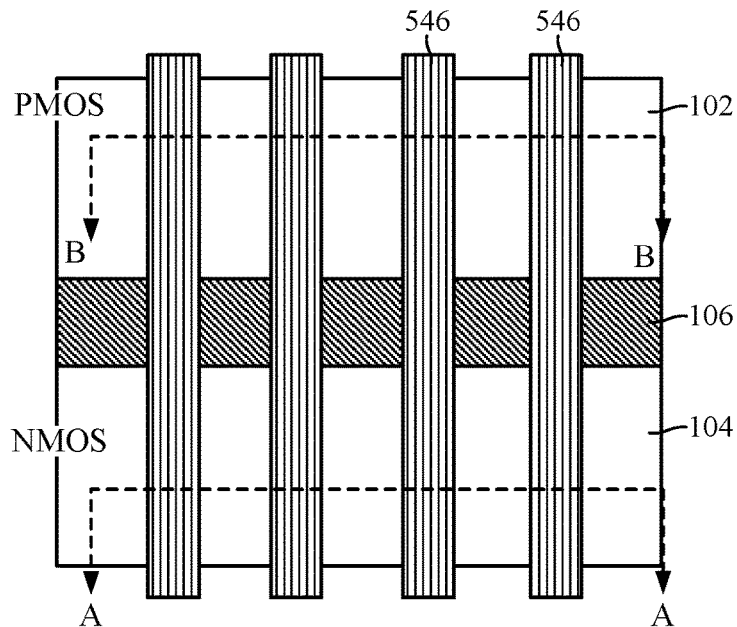
FIG. 5A illustrates a top view of gate regions disposed above the semiconductor regions of FIG. 4A, in accordance with certain aspects of the present disclosure.
Figure 5C:
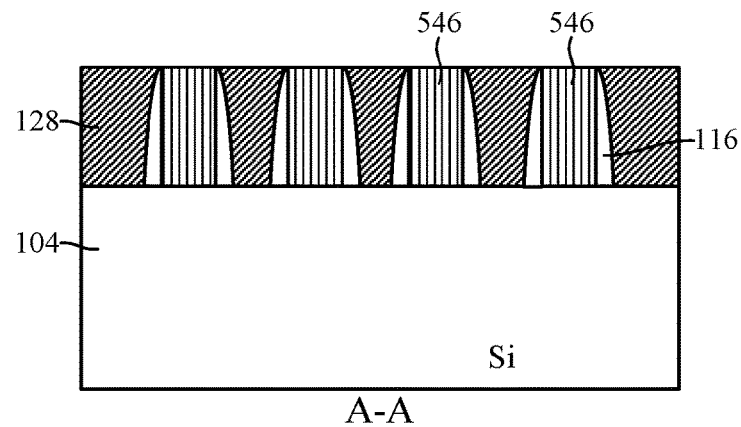
FIG. 5C illustrates a cross-sectional view of the other semiconductor region of FIG. 5A, in accordance with certain aspects of the present disclosure.

Referring to FIGS. 5A-C, gate regions 546 may be formed above the semiconductor regions 102, 104. A gate region 546 may include, for example, a dielectric layer (e.g., silicon dioxide) and a non-insulative region (e.g., a polysilicon gate) disposed above the dielectric layer. A "non-insulative region" generally refers to a region that may be electrically conductive or semiconductive. The gate spacers 116 may be formed above the semiconductor regions 102, 104 and adjacent to each of the gate regions 546. The interlayer dielectric regions 128 may also be formed above the semiconductor regions 102, 104.

Figure 6B:
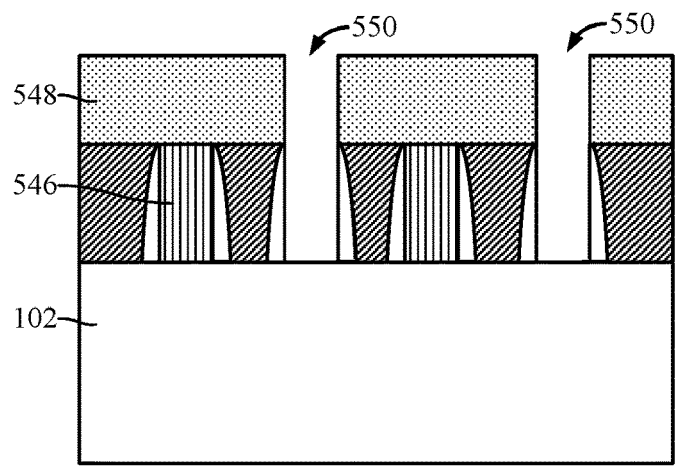
FIG. 6B illustrates a cross-sectional view of one of the semiconductor regions of FIG. 6A, in accordance with certain aspects of the present disclosure.
Figure 6A:
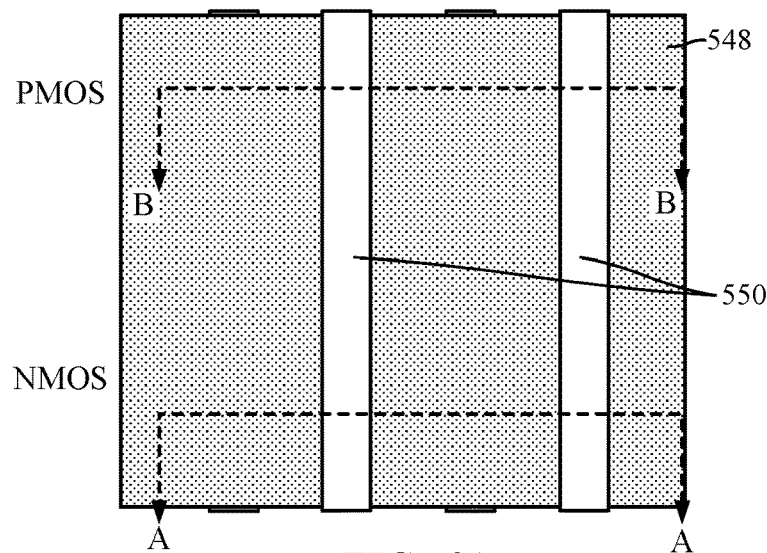
FIG. 6A illustrates a top view of removing some of the gate regions disposed above the semiconductor regions of FIG. 5A, in accordance with certain aspects of the present disclosure.
Figure 6C:
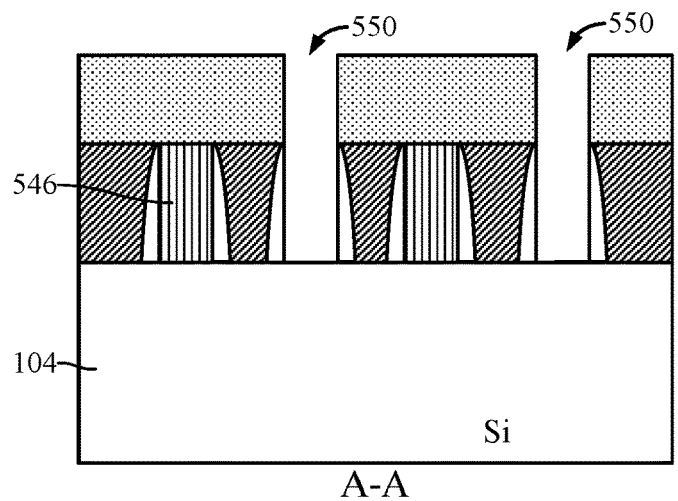
FIG. 6C illustrates a cross-sectional view of the other semiconductor region of FIG. 6A, in accordance with certain aspects of the present disclosure.
Figure 7B:
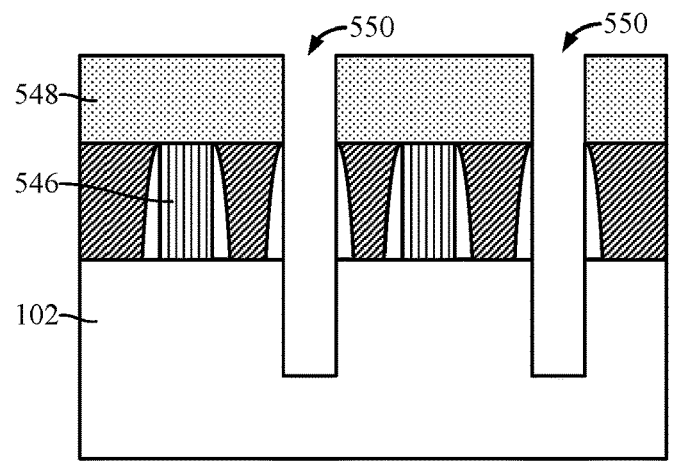
FIG. 7B illustrates a cross-sectional view of one of the semiconductor regions of FIG. 7A, in accordance with certain aspects of the present disclosure.
Figure 7A:
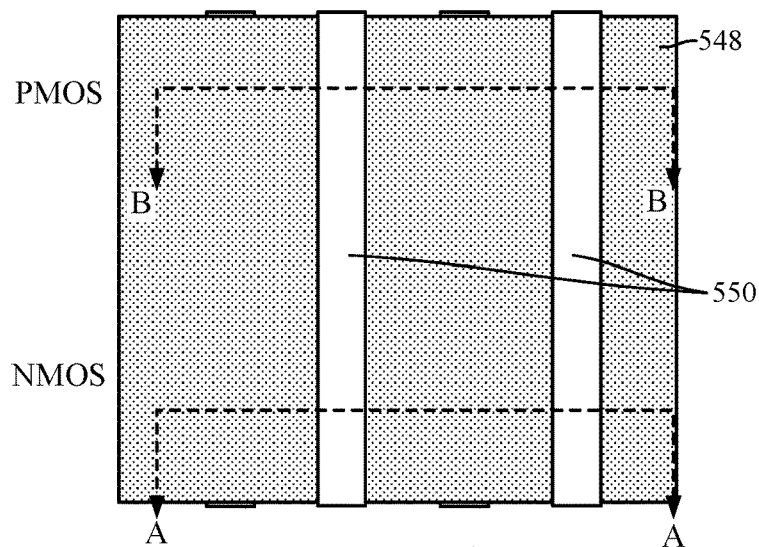
FIG. 7A illustrates a top view of forming trenches in the semiconductor regions of FIG. 6A, in accordance with certain aspects of the present disclosure.
Figure 7C:
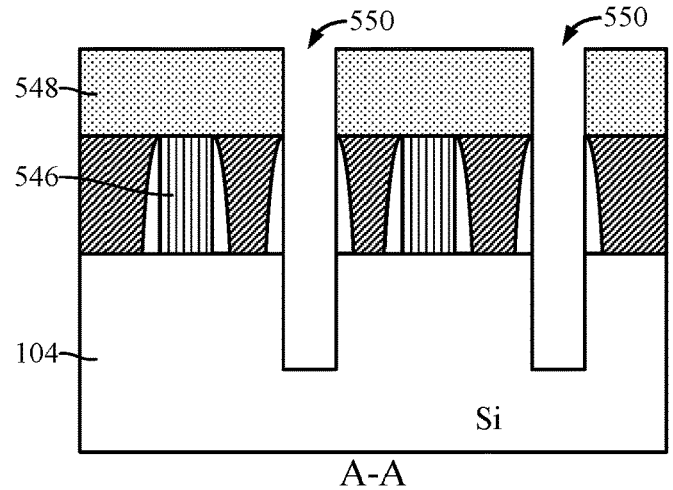
FIG. 7C illustrates a cross-sectional view of the other semiconductor region of FIG. 7A, in accordance with certain aspects of the present disclosure.

As depicted in FIGS. 6A-C, a first mask 548 may be formed above the gate regions 546, and first trenches 550 may be formed to remove some of the gate regions 546 in regions where the various SDBs (e.g., the SDB 108, 208, or 308) may be formed. Referring to FIGS. 7A-C, the first trenches 550 may be deepened to intersect a portion of the semiconductor regions 102, 103.

Figure 8B:
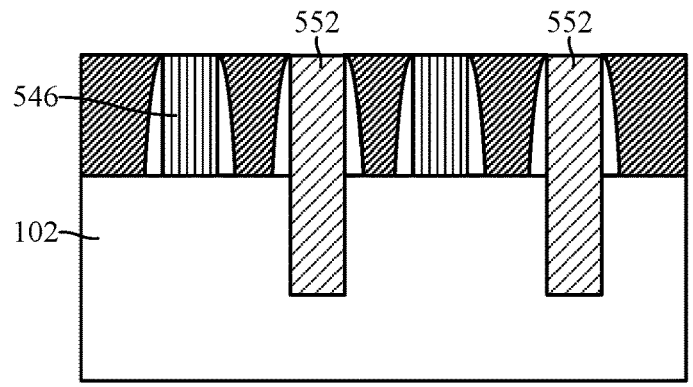
FIG. 8B illustrates a cross-sectional view of one of the semiconductor regions of FIG. 8A, in accordance with certain aspects of the present disclosure.
Figure 8A:
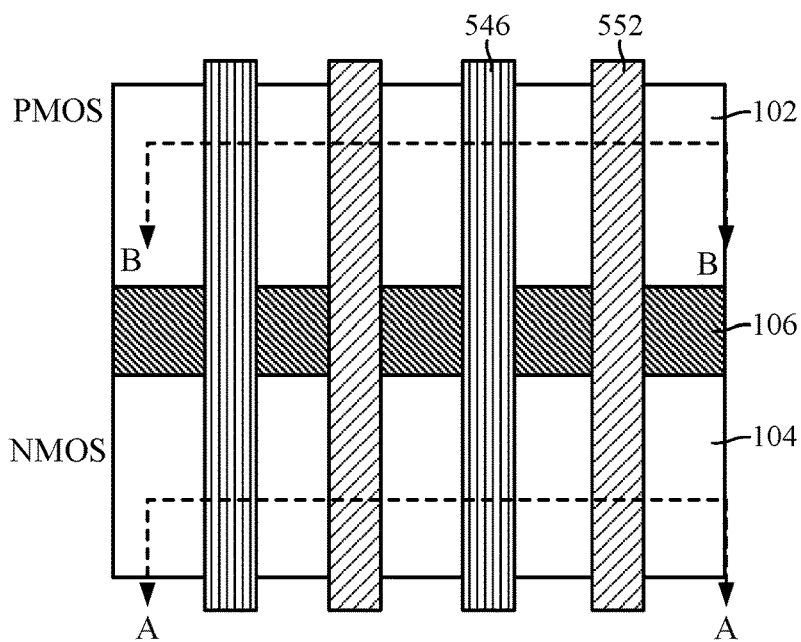
FIG. 8A illustrates a top view of filling the trenches with an insulating material in the semiconductor regions of FIG. 7A, in accordance with certain aspects of the present disclosure.
Figure 8C:
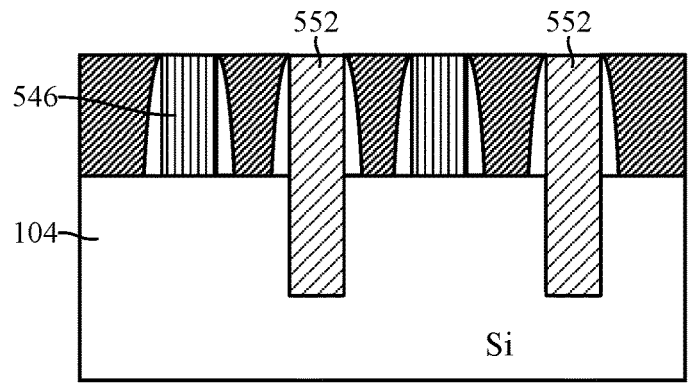
FIG. 8C illustrates a cross-sectional view of the other semiconductor region of FIG. 8A, in accordance with certain aspects of the present disclosure.

As illustrated in FIGS. 8A-C, the first mask 548 may be removed, and the first trenches 550 may be filled with an insulating material 552 (e.g., silicon dioxide or silicon nitride) to form the insulator (e.g., the insulator 112 of FIGS. 1A, 2A, and 3A) of the SDBs. For example, the insulating material may be deposited in the first trenches 550 using a chemical vapor deposition (e.g., chemical vapor evaporation) process and/or a spin-on coating process. In certain aspects, the first trenches 550 may be partially filled with a silicon nitride liner and filled with a spin-on dielectric such as silicon dioxide.

Figure 9B:
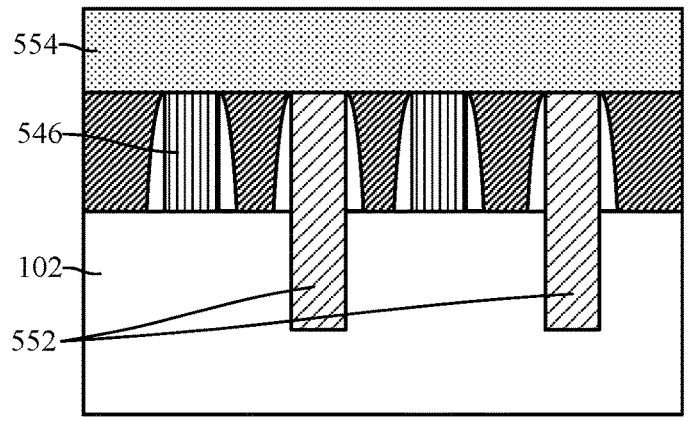
FIG. 9B illustrates a cross-sectional view of one of the semiconductor regions of FIG. 9A, in accordance with certain aspects of the present disclosure.
Figure 9A:
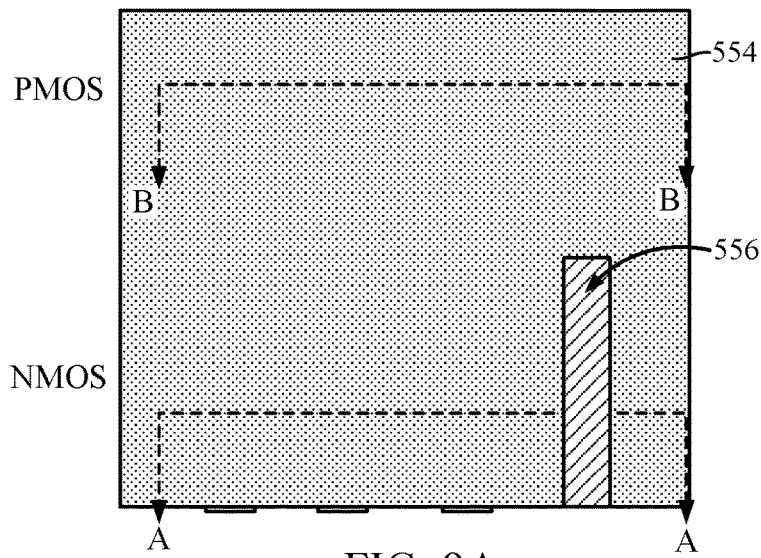
FIG. 9A illustrates a top view of forming a mask above the semiconductor regions of FIG. 8A and opening the mask for a conductive portion of an SDB, in accordance with certain aspects of the present disclosure.
Figure 9C:
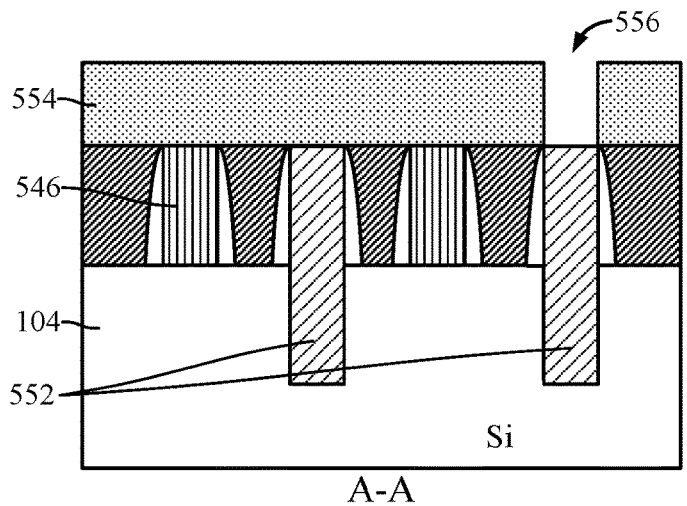
FIG. 9C illustrates a cross-sectional view of the other semiconductor region of FIG. 9A, in accordance with certain aspects of the present disclosure.
Figure 10B:
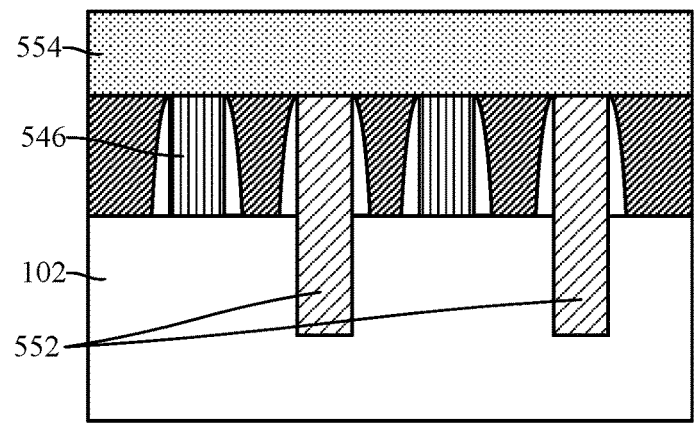
FIG. 10B illustrates a cross-sectional view of one of the semiconductor regions of FIG. 10A, in accordance with certain aspects of the present disclosure.
Figure 10A:
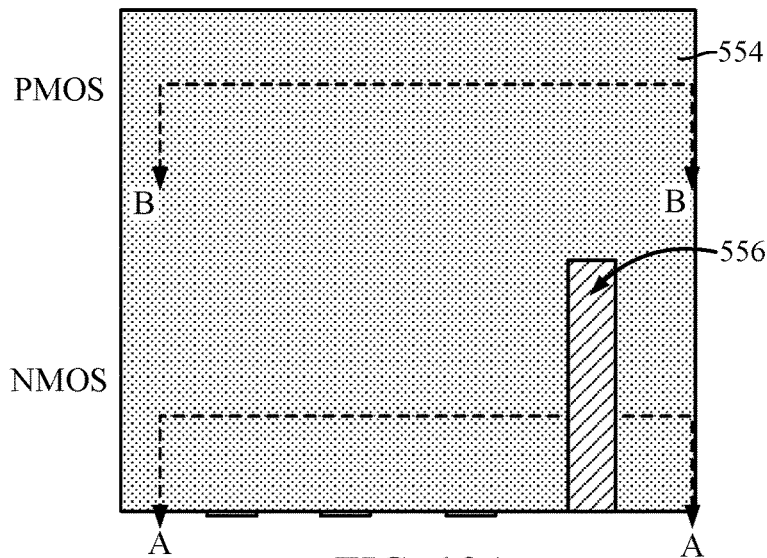
FIG. 10A illustrates a top view of further forming a cavity for a conductive portion of an SDB, in accordance with certain aspects of the present disclosure.
Figure 10C:
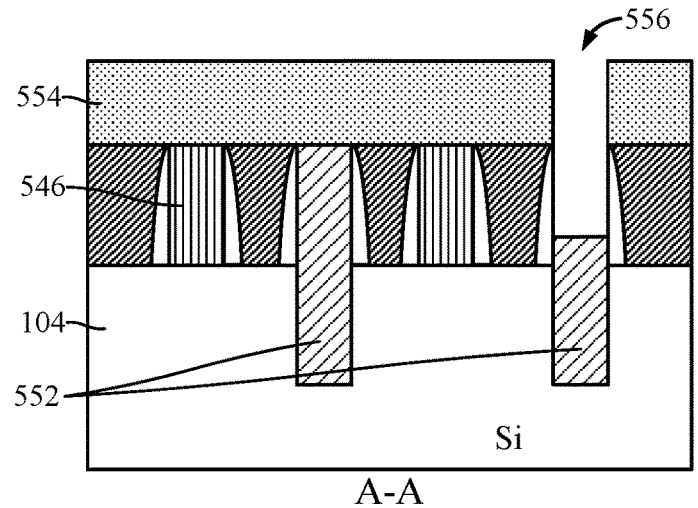
FIG. 10C illustrates a cross-sectional view of the other semiconductor region of FIG. 10A, in accordance with certain aspects of the present disclosure.

Referring to FIGS. 9A-C, a second mask 554 may be formed above the gate regions 546 and insulating material 552, and a second trench 556 may be formed to remove masking material in regions where the various conductive portions of the SDBs (e.g., the SDB 108, 208, or 308) may be formed. In this example, the second trench 556 is only formed over the second semiconductor region 104 and dielectric region 106 to form an SDB having a segment that is electrically conducting and insulating and another segment that is entirely electrically insulating (e.g., the SDB 208). As shown in FIGS. 10A-C, the second trench 556 may be deepened to remove a portion of the insulating material 552 such that a segment of the insulating material 552 extends above a surface of the second semiconductor region 104, for example, as described herein with respect to FIG. 1B. For example, a portion of the insulating material 552 may be removed using an etching process, such as a chemical or plasma etching process. While the example provided herein depicts the second trench 556 being formed only over the second semiconductor region 104 and dielectric region 106, aspects of the present disclosure may also be applied to the second trenches 556 being formed over the semiconductor regions 102, 104 and dielectric region 106 to form SDBs with conductive portions as described herein with respect to FIGS. 1A and 3A.

Figure 11B:
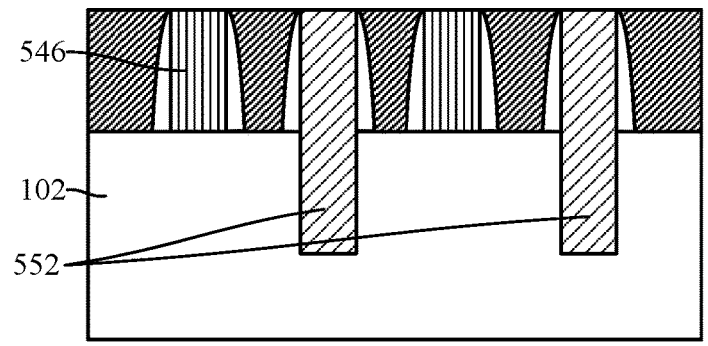
FIG. 11B illustrates a cross-sectional view of one of the semiconductor regions of FIG. 11A, in accordance with certain aspects of the present disclosure.
Figure 11A:
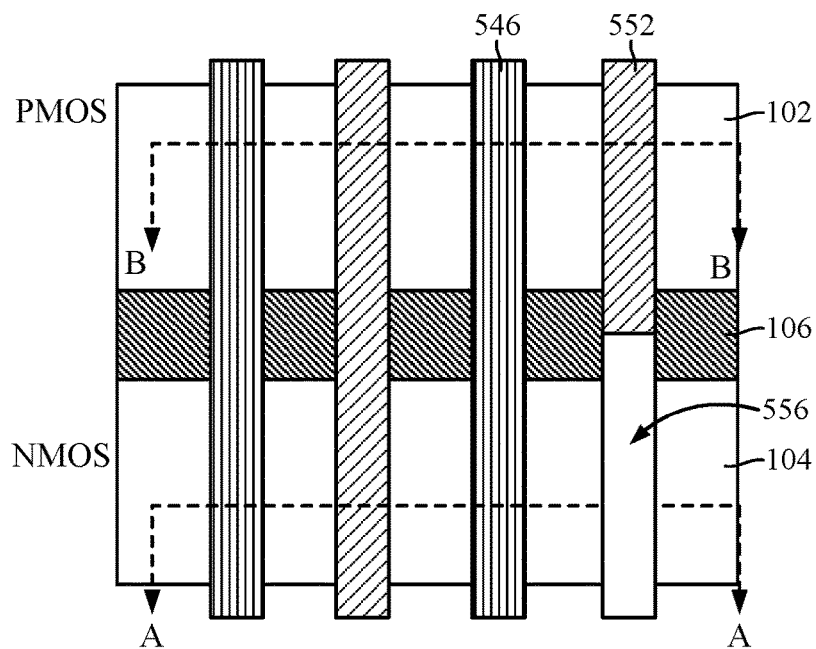
FIG. 11A illustrates a top view of removing the mask above the semiconductor regions of FIG. 10A, in accordance with certain aspects of the present disclosure.
Figure 11C:
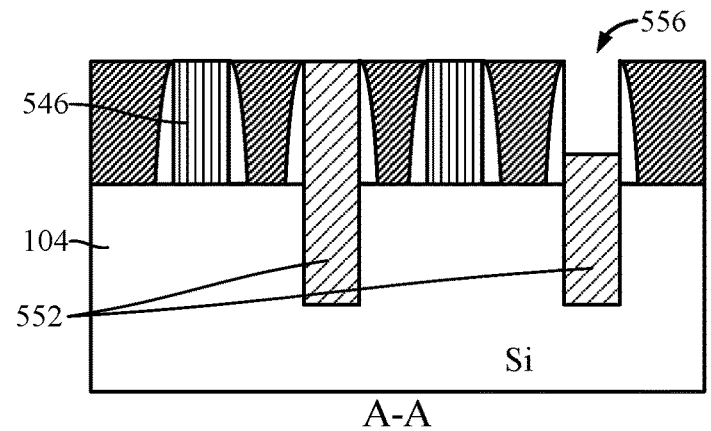
FIG. 11C illustrates a cross-sectional view of the other semiconductor region of FIG. 11A, in accordance with certain aspects of the present disclosure.
Figure 12B:
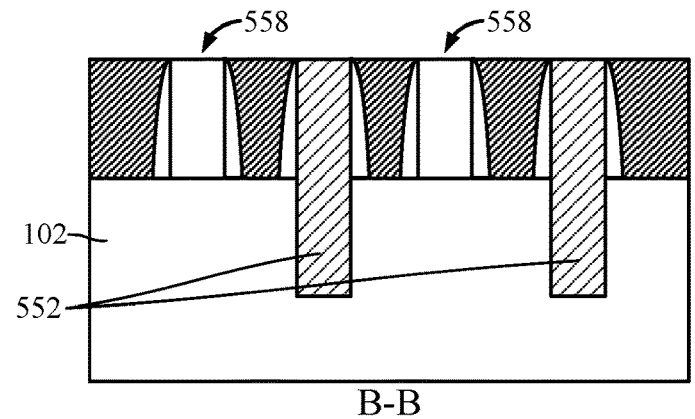
FIG. 12B illustrates a cross-sectional view of one of the semiconductor regions of FIG. 12A, in accordance with certain aspects of the present disclosure.
Figure 12A:
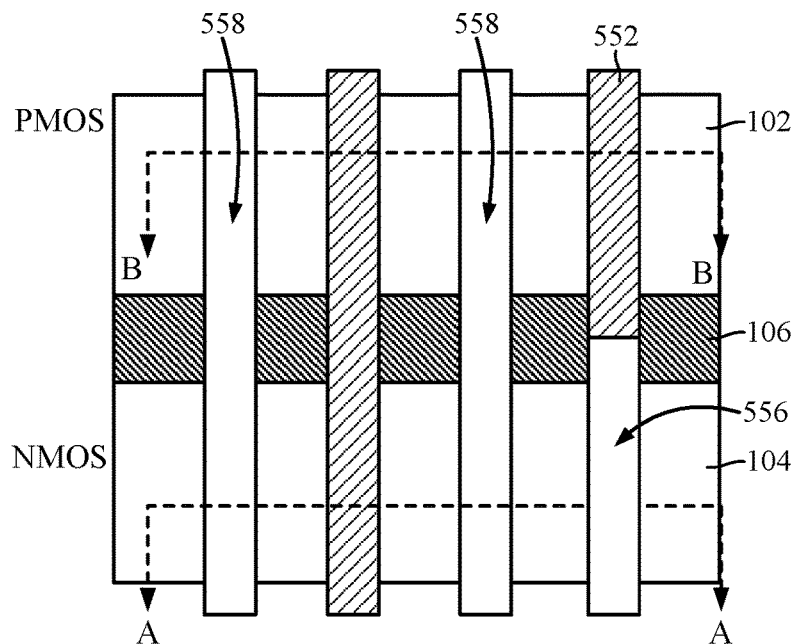
FIG. 12A illustrates a top view of removing gate regions from the semiconductor regions of FIG. 11A, in accordance with certain aspects of the present disclosure.
Figure 12C:
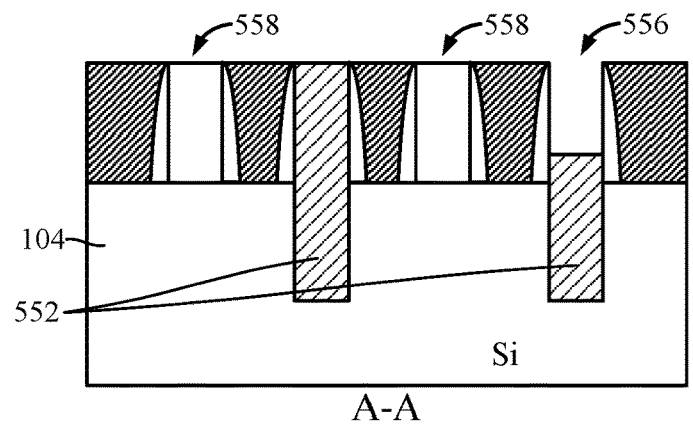
FIG. 12C illustrates a cross-sectional view of the other semiconductor region of FIG. 12A, in accordance with certain aspects of the present disclosure.

As depicted in FIGS. 11A-C, the second mask 554 may be removed. Referring to FIGS. 12A-C, third trenches 558 may be formed to remove at least a portion of the gate regions 546.

Figure 13B:
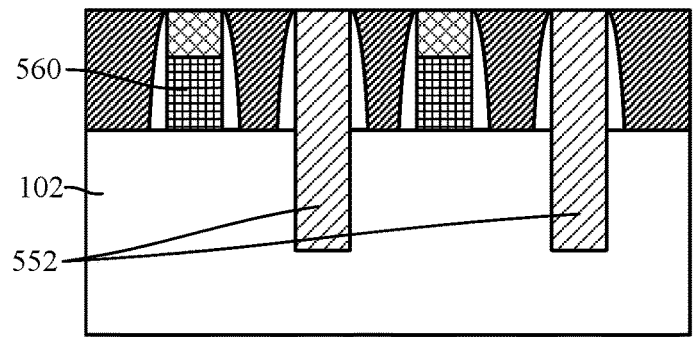
FIG. 13B illustrates a cross-sectional view of one of the semiconductor regions of FIG. 13A, in accordance with certain aspects of the present disclosure.
Figure 13A:
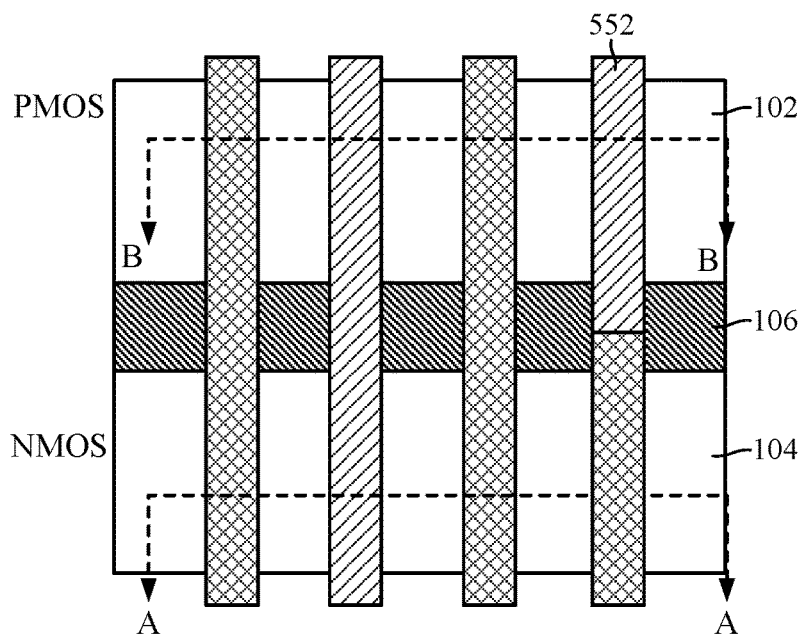
FIG. 13A illustrates a top view of depositing the conductive portion of the SDB and gate conductors of the transistors of FIG. 12A, in accordance with certain aspects of the present disclosure.
Figure 13C:
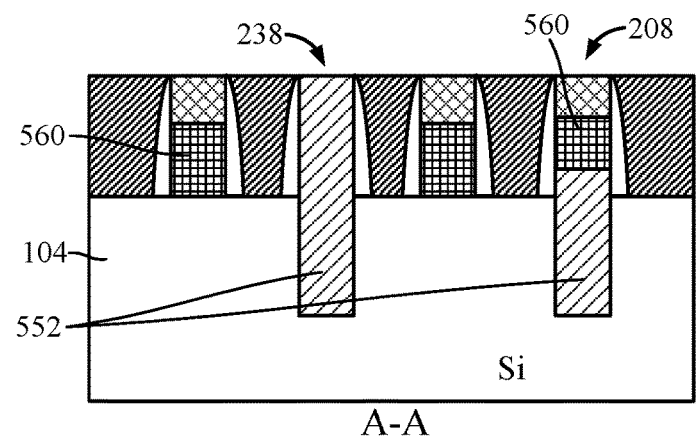
FIG. 13C illustrates a cross-sectional view of the other semiconductor region of FIG. 13A, in accordance with certain aspects of the present disclosure.

As shown in FIGS. 13A-C, a gate stack 560 may be deposited in the third trenches 558 as depicted in FIGS. 12A-C. The gate stack 560 may include various layers including a high-k dielectric material, work-function metal layers, and a gate conductor, for example. The gate stack 560 may form the gate terminals of various transistors and/or conductive portions of the SDBs, for example, as described herein with respect to FIGS. 1A, 2A, and 3A. The conductive portions of the SDBs may be formed using the same process and material(s) used to form the gate terminals of the various transistors included in a semiconductor device. For example, during a front-end-of-line fabrication process, the conductive portions of the SDBs may be formed at the same time as the gate terminals of the transistors.

Figure 14:
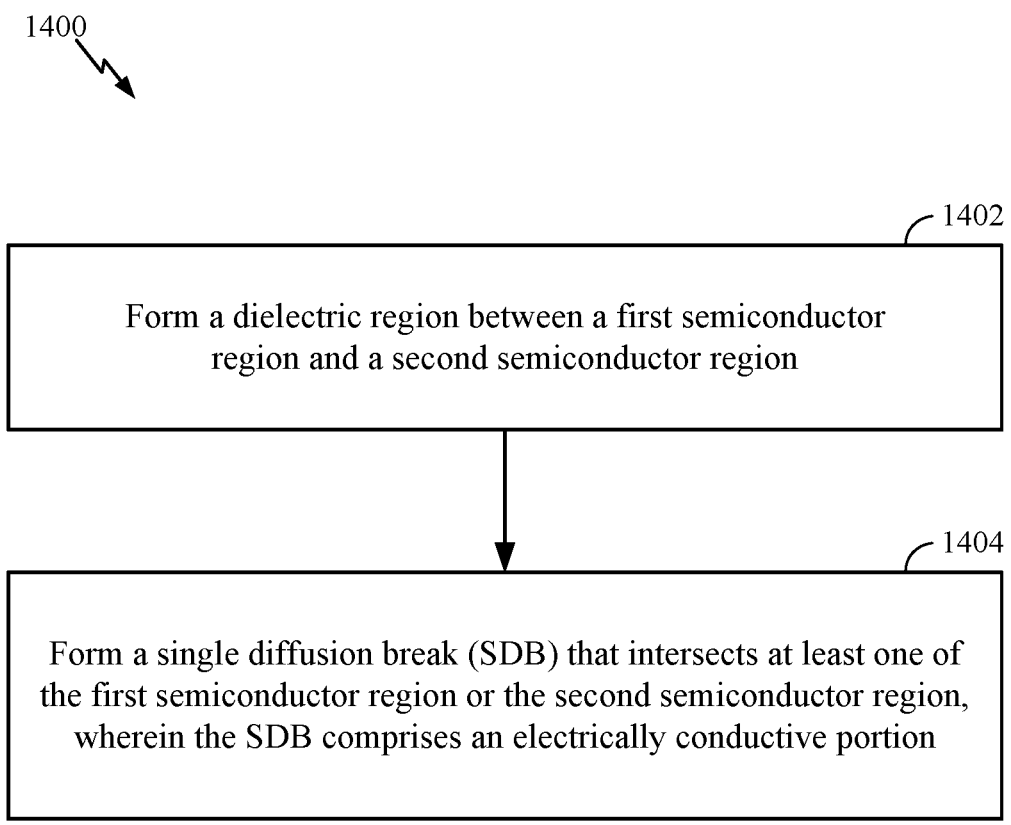
FIG. 14 is a flow diagram of example operations for fabricating a semiconductor device, in accordance with certain aspects of the present disclosure.

FIG. 14 is a flow diagram of example operations 1400 for fabricating a semiconductor device having an SDB with a conductive portion (e.g., the SDB 108, 208, 308), in accordance with certain aspects of the present disclosure. The operations 1400 may be performed by a semiconductor fabrication facility, for example.

The operations 1400 begin, at block 1402, by forming a dielectric region (e.g., the dielectric region 106) between a first semiconductor region (e.g., the first semiconductor region 102) and a second semiconductor region (e.g., the second semiconductor region 104). At block 1404, an SDB (e.g., the SDB 108, 208, 308) having an electrically conductive portion (e.g., the conductive portion 110) may be formed that intersects at least one of the first semiconductor region or the second semiconductor region.

In certain aspects, forming the SDB at block 1404 may include performing operations similar to the operations described herein with respect to FIGS. 4A-13C. For example, to fabricate an SDB (e.g., the SDB 108) with an electrically conductive portion that is electrically coupled to an active gate of a transistor, forming the SDB at block 1404 may include forming a cavity (e.g., the first trenches 550) in a portion of the second semiconductor region, forming an insulator (e.g., the insulator 112 or insulating material 552) in the cavity that intersects at least a portion of the first semiconductor region, and forming a first segment (e.g., the segment 118) of the conductive portion of the SDB above the insulator and a second segment (e.g., the segment 120) of the conductive portion above a portion of the second semiconductor region. The transistor may be formed from a portion of the first semiconductor region and another segment of the conductive portion of the SDB, which may be electrically coupled to the portion of the second semiconductor region.

In other aspects, to fabricate an SDB (e.g., SDB 208) with a segment that is electrically conducting and insulating and another segment that is entirely electrically insulating, forming the SDB at block 1404 may include forming a cavity (e.g., the first trenches 550) in a portion of the first semiconductor region and a portion of the second semiconductor region, forming an insulator (e.g., the insulator 112 or insulating material 552) in the cavity, and forming the conductive portion of the SDB above a segment of the insulator that intersects the second semiconductor region. In this example, forming the SDB at block 1404 may include performing the operations described herein with respect to FIGS. 4A-13C.

In aspects, to fabricate an SDB (e.g., SDB 308) with an electrically conductive portion that is electrically separated from the semiconductor regions, forming the SDB at block 1404 may include forming a cavity (e.g., the first trenches 550) in a portion of the first semiconductor region and a portion of the second semiconductor region, forming an insulator (e.g., the insulator 112 or insulating material 552) in the cavity, and forming the conductive portion above the insulator and above the first semiconductor region and the second semiconductor region. In this example, forming the SDB at block 1404 may include performing operations similar to the operations described herein with respect to FIGS. 4A-13C.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A semiconductor device, comprising:
   a first semiconductor region;
   a second semiconductor region;
   a dielectric region disposed between the first semiconductor region and the second semiconductor region, wherein the dielectric region comprises a shallow trench isolation (STI) region; and
   a single diffusion break (SDB) intersecting at least one of the first semiconductor region or the second semiconductor region, wherein the SDB comprises an electrically conductive portion.

2. The semiconductor device of claim 1, wherein the conductive portion of the SDB is disposed above the at least one of the first semiconductor region or the second semiconductor region.

3. The semiconductor device of claim 1, wherein:
   the conductive portion of the SDB is disposed above the first semiconductor region and the second semiconductor region;
   the SDB further comprises an insulator that intersects at least a portion of the second semiconductor region; and
   a segment of the conductive portion of the SDB is disposed above the insulator.

4. The semiconductor device of claim 3, wherein a portion of the insulator extends above a surface of the second semiconductor region and wherein the segment of the conductive portion is displaced from the second semiconductor region by the portion of the insulator.

5. The semiconductor device of claim 3, further comprising a transistor comprising a portion of the first semiconductor region and another segment of the conductive portion of the SDB, wherein the other segment of the conductive portion is electrically coupled to the portion of the first semiconductor region and is a gate terminal of the transistor.

6. The semiconductor device of claim 5, wherein the transistor is a p-type metal-oxide-semiconductor (PMOS) transistor or an n-type metal-oxide-semiconductor (NMOS) transistor.

7. The semiconductor device of claim 1, wherein:
   the SDB further comprises an insulator that intersects the first semiconductor region and the second semiconductor region; and the conductive portion of the SDB is disposed above a segment of the insulator that intersects the second semiconductor region.

8. The semiconductor device of claim 7, wherein:
another segment of the insulator extends above a surface of the second semiconductor region; and
the conductive portion of the SDB is displaced from the second semiconductor region by the other segment of the insulator.

9. The semiconductor device of claim 7, further comprising:
a conductive trace disposed above the first semiconductor region and the second semiconductor region, wherein the conductive trace is laterally spaced from the SDB;
a first transistor comprising a portion of the first semiconductor region and a first segment of the conductive trace, wherein the first segment of the conductive trace is electrically coupled to the portion of the first semiconductor region and is a gate terminal of the first transistor; and
a second transistor comprising a portion of the second semiconductor region and a second segment of the conductive trace, wherein the second segment of the conductive trace is electrically coupled to the portion of the second semiconductor region and is a gate terminal of the second transistor.

10. The semiconductor device of claim 9, further comprising:
an additional SDB intersecting the first semiconductor region and the second semiconductor region, wherein the additional SDB comprises an additional insulator that intersects the first semiconductor region and the second semiconductor region and wherein the first and second transistors are disposed between the SDB and the additional SDB.

11. A semiconductor device, comprising:
a first semiconductor region;
a second semiconductor region;
a dielectric region disposed between the first semiconductor region and the second semiconductor region;
a single diffusion break (SDB) intersecting at least one of the first semiconductor region or the second semiconductor region, wherein the SDB comprises:
an electrically conductive portion disposed above the first semiconductor region and the second semiconductor region; and
an insulator that intersects the first semiconductor region and the second semiconductor region;
a conductive trace disposed above the first semiconductor region and the second semiconductor region, wherein the conductive trace is laterally spaced from the SDB;
a first transistor comprising a portion of the first semiconductor region and a first segment of the conductive trace, wherein the first segment of the conductive trace is electrically coupled to the portion of the first semiconductor region and is a gate terminal of the first transistor;
a second transistor comprising a portion of the second semiconductor region and a second segment of the conductive trace, wherein the second segment of the conductive trace is electrically coupled to the portion of the second semiconductor region and is a gate terminal of the second transistor; and
an additional SDB intersecting the first semiconductor region and the second semiconductor region, wherein:
the additional SDB is laterally spaced from the conductive trace;
the additional SDB comprises an additional insulator that intersects the first semiconductor region and the second semiconductor region; and
the first and second transistors are disposed between the SDB and the additional SDB.

12. The semiconductor device of claim 1, further comprising a dielectric cap disposed above the conductive portion.

13. The semiconductor device of claim 1, further comprising interlayer dielectric regions disposed above the first semiconductor region, the second semiconductor region, and the dielectric region, wherein the SDB is disposed between the interlayer dielectric regions.

14. A method of fabricating a semiconductor device, comprising:
forming a dielectric region between a first semiconductor region and a second semiconductor region, wherein the dielectric region comprises a shallow trench isolation (STI) region; and
forming a single diffusion break (SDB) that intersects at least one of the first semiconductor region or the second semiconductor region, wherein the SDB comprises an electrically conductive portion.

15. The method of claim 14, wherein forming the SDB comprises:
forming a cavity in a portion of the second semiconductor region;
forming an insulator in the cavity; and
forming a first segment of the conductive portion of the SDB above the insulator and a second segment of the conductive portion above a portion of the first semiconductor region.

16. The method of claim 14, wherein forming the SDB comprises:
forming a cavity in a portion of the first semiconductor region and a portion of the second semiconductor region;
forming an insulator in the cavity; and
forming the conductive portion of the SDB above a segment of the insulator that intersects the second semiconductor region.

17. The method of claim 14, wherein forming the SDB comprises:
forming a cavity in a portion of the first semiconductor region and a portion of the second semiconductor region;
forming an insulator in the cavity; and
forming the conductive portion above the insulator and above the first semiconductor region and the second semiconductor region.

18. The semiconductor device of claim 1, wherein:
the first semiconductor region comprises a p+ doped semiconductor;
the second semiconductor region comprises an n+ doped semiconductor; and
the SDB intersects the dielectric region.

19. The semiconductor device of claim 18, wherein:
the first semiconductor region is a PMOS region;
the second semiconductor region is an NMOS region;
the p+ doped semiconductor is a first implant region for a source or drain region; and
the n+ doped semiconductor is a second implant region for the source or drain region.

20. The semiconductor device of claim 11, wherein:
the first semiconductor region comprises a p+ doped semiconductor; and the second semiconductor region comprises an n+ doped semiconductor.

\* \* \* \* \*